US009947383B1

(12) United States Patent
Liu et al.

(10) Patent No.: US 9,947,383 B1
(45) Date of Patent: Apr. 17, 2018

(54) SPIN HALL WRITE SELECT FOR MAGNETO-RESISTIVE RANDOM ACCESS MEMORY

(71) Applicant: International Business Machines Corporation, Armonk, NY (US)

(72) Inventors: Luqiao Liu, Brookline, MA (US); Jonathan Z. Sun, Shrub Oak, NY (US); Daniel C. Worledge, San Jose, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/440,761

(22) Filed: Feb. 23, 2017

(51) Int. Cl.
| G11C 11/16 | (2006.01) |
| H01L 43/02 | (2006.01) |
| H01L 43/08 | (2006.01) |

(52) U.S. Cl.
CPC ........ *G11C 11/1675* (2013.01); *G11C 11/161* (2013.01); *H01L 43/02* (2013.01); *H01L 43/08* (2013.01)

(58) Field of Classification Search
CPC .............. G11C 11/161; G11C 11/1675; G11C 11/1693; H01L 43/02; H01L 43/08
See application file for complete search history.

(56) References Cited

U.S. PATENT DOCUMENTS

| 6,363,007 B1* | 3/2002 | Lu ............................ G11C 8/18 365/158 |
| 7,368,301 B2* | 5/2008 | Guo ........................ B82Y 25/00 438/3 |
| 7,480,171 B2* | 1/2009 | Peng ....................... B82Y 10/00 365/158 |

(Continued)

FOREIGN PATENT DOCUMENTS

| EP | 2671155 A4 | 3/2016 |
| WO | 2014142922 A1 | 9/2014 |
| WO | 2014204492 A1 | 12/2014 |

OTHER PUBLICATIONS

Worledge et al., "Switching distributions and write reliability of perpendicular spin torque MRAM", IEEE, 2010, 4 pages.

(Continued)

*Primary Examiner* — Vanthu Nguyen
(74) *Attorney, Agent, or Firm* — Cantor Colburn LLP; Vazken Alexanian

(57) ABSTRACT

A magneto-resistance random access memory (MRAM) cell includes a transistor, a wire and a magnetic tunnel junction (MTJ). The MTJ includes a fixed layer of fixed magnetic polarity electrically connected with the transistor, a free layer of variable magnetic polarity electrically connected with the wire and an insulator between the fixed and free layers. First current passed through the wire destabilizes the variable magnetic polarity of the free layer. Second current passed through the transistor in one of two directions during first current passage through the wire directs the variable (Continued)

magnetic polarity of the free layer toward a parallel or anti-parallel condition with respect to the fixed magnetic polarity of the fixed layer. A ceasing of the first current prior to a ceasing of the second current sets the variable magnetic polarity of the free layer in the parallel or anti-parallel condition.

19 Claims, 6 Drawing Sheets

(56) References Cited

U.S. PATENT DOCUMENTS

| | | | |
|---|---|---|---|
| 8,130,534 B2* | 3/2012 | Abu-Rahma | G11C 11/1659 365/148 |
| 8,169,815 B2* | 5/2012 | Javerliac | G11C 11/1675 365/158 |
| 8,611,140 B2* | 12/2013 | El Baraji | G11C 11/161 365/158 |
| 8,611,141 B2* | 12/2013 | Baraji | G11C 11/16 365/158 |
| 8,659,938 B2* | 2/2014 | Prejbeanu | G11C 11/16 365/100 |
| 9,171,601 B2* | 10/2015 | Shukh | G11C 11/16 |
| 2014/0252438 A1* | 9/2014 | Shukh | G11C 11/1675 257/295 |
| 2014/0252439 A1 | 9/2014 | Guo | |
| 2014/0264671 A1 | 9/2014 | Chepulskyy et al. | |
| 2015/0097159 A1 | 4/2015 | Apalkov et al. | |
| 2016/0141333 A1 | 5/2016 | Bandyopadhyay et al. | |

OTHER PUBLICATIONS

Sharad et al., "Domain-Wall Shift Based Multi-Level MRAM for High-Speed, High-Density and Energy-Efficient Caches", IEEE, 2013, pp. 99-100.

* cited by examiner

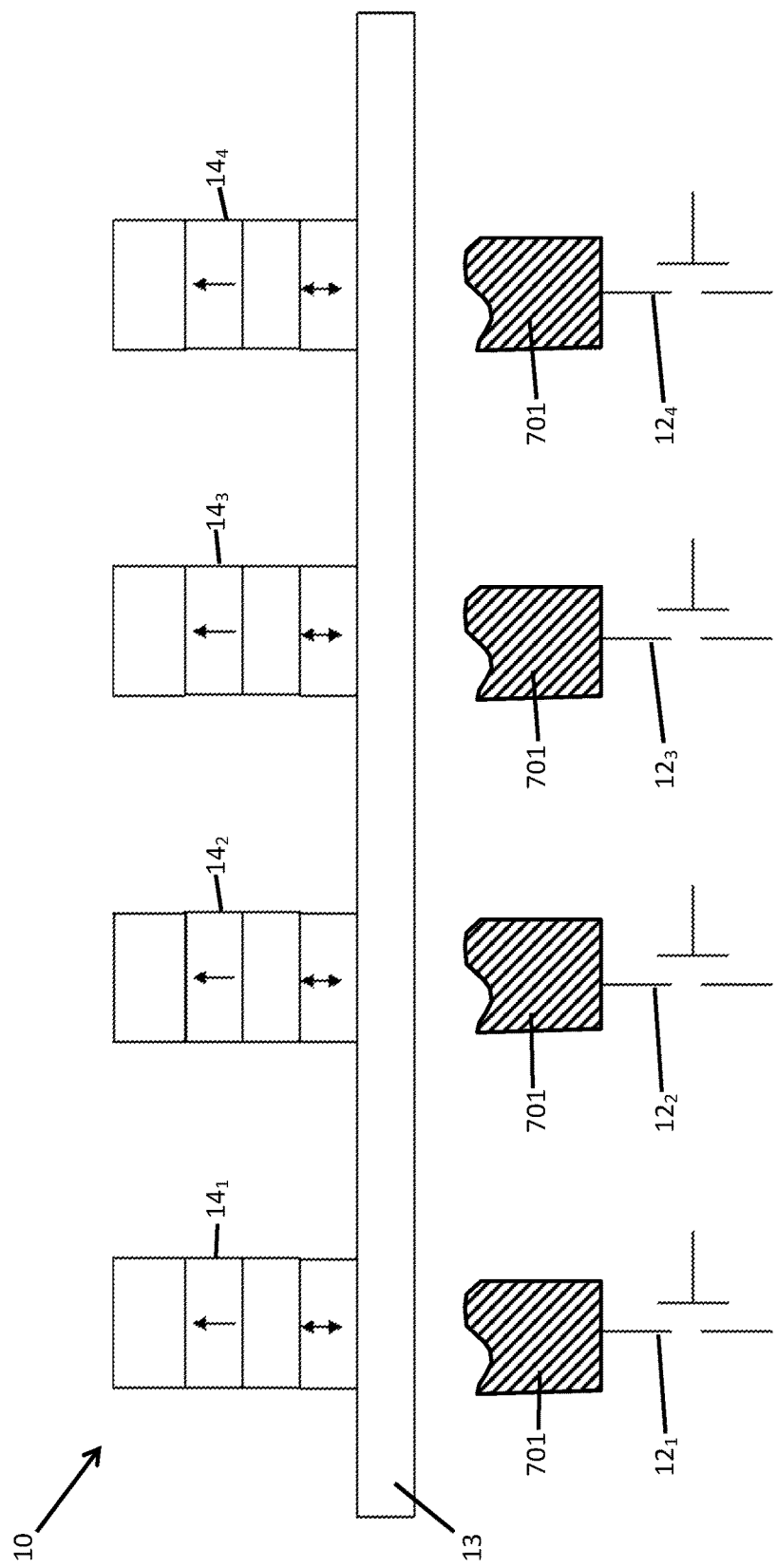

SPIN HALL WRITE SELECT FOR MAGNETO-RESISTIVE RANDOM ACCESS MEMORY

BACKGROUND

The present invention relates in general to magneto-resistive random access memory (MRAM). More particularly, the present invention relates to a spin hall write selection apparatus and method for use with MRAM.

Data in MRAM is stored by magnetic storage elements. The elements are formed from ferromagnetic plates that each hold a magnetization and which are separated by a thin insulating layer. One of the two plates is provided as a permanent magnet, which is set to a particular polarity, and the magnetization of the other plate can be changed to match that of an external field in order to store data. This configuration is known as a magnetic tunnel junction (MTJ). A memory device can be built from a grid of MTJ "cells."

Reading from an MRAM memory device can be accomplished by measurement of electrical resistance of a cell. A particular cell is typically selected by powering an associated transistor that switches current from a supply line through the cell to ground. Due to the tunnel magneto-resistance, the electrical resistance of the cell changes due to the relative orientation of the magnetization in the two plates. By measuring the resulting current, the resistance inside any particular cell can be determined and from this the magnetization polarity of the writable plate can be determined as well. If the two plates have the same magnetization alignment (low resistance state) this is usually considered to mean a "1" while if the alignment is antiparallel the resistance will be higher (high resistance state) and this usually means a "0."

Data is written to the cells using a variety of methods. In one, each cell lies between a pair of write lines arranged at right angles to each other and in parallel to the cell, one above and one below the cell. When current is passed through them, an induced magnetic field is created at the junction, which the writable plate picks up. However, since this approach requires a fairly substantial current to generate the field, it is typically less applicable for low-power cases and is thus illustrative of one of MRAM's primary disadvantages. Additionally, as the device is scaled down in size, there comes a time when the induced field overlaps adjacent cells over a small area, leading to potential false writes. This problem, the half-select (or write disturb) problem, appeared to set a fairly large minimum size for this type of cell.

Newer techniques have therefore been proposed to avoid the above-described issues. One such technique relates to spin transfer torque (STT) or spin transfer switching and uses spin-aligned ("polarized") electrons to directly apply torque to the domains.

Spin torque MRAM uses a 2-terminal device with a pinned or fixed layer that has a fixed magnetization polarity, a tunnel barrier and a free layer that has a free or variable magnetization polarity. The fixed layer, the tunnel barrier and the free layer are provided in a MTJ stack. The magnetization of the fixed layer is fixed in a given direction and a current passed up through the junction stack makes the magnetization of the free layer parallel with respect to that of the fixed layer whereas a current passed down through the junction stack makes the magnetization of the free layer anti-parallel with respect to that of the fixed layer. A relatively smaller current (of either polarity) is then used to read the resistance of the device which is dependent on the relative orientations of the free and fixed layers.

In previous applications of spin torque MRAM, the free and fixed layers have their magnetizations lie in-plane. However, this leads to the need for high switching currents. While materials with perpendicular or non in-plane magnetization can be used (i.e., perpendicular magnetic anisotropy or PMA), the switching currents are still higher than desired.

SUMMARY

According to an embodiment of the present invention, a magneto-resistance random access memory (MRAM) cell includes a transistor, a wire and a magnetic tunnel junction (MTJ). The MTJ includes a fixed layer of fixed magnetic polarity electrically connected with the transistor, a free layer of variable magnetic polarity electrically connected with the wire and an insulator between the fixed and free layers. First current passed through the wire destabilizes the variable magnetic polarity of the free layer. Second current passed through the transistor in one of two directions during first current passage through the wire directs the variable magnetic polarity of the free layer toward a parallel or anti-parallel condition with respect to the fixed magnetic polarity of the fixed layer. A ceasing of the first current prior to a ceasing of the second current sets the variable magnetic polarity of the free layer in the parallel or anti-parallel condition.

The MRAM cell does not exhibit write errors that have been problematic for conventional spin torque MRAM. The wire supplies spins at 90 degrees to the initial free layer magnetization direction and thus ensures that the free layer responds in a reliable manner.

In accordance with additional, alternative or optional embodiments, the first current exceeds the second current and the second current is initiated and ceased about 5-10 ns or less after the first current is initiated and ceased, respectively.

The initiation of the first current about 5-10 ns or less before the initiation of the second current provides sufficient time for destabilization. Similarly, the ceasing of the first current about 5-10 ns or less before the ceasing of the second current provides sufficient time for setting of free layer magnetization.

According to another embodiment of the present invention, a magneto-resistance random access memory (MRAM) cell includes a wire, a plurality of transistors a plurality of MTJs each of which is respectively electrically connected between the wire and a corresponding one of the plurality of transistors and a controller. The controller is coupled to the wire and the plurality of transistors. The controller is configured to sequentially pass and cease first and second currents through the wire and the plurality of transistors, respectively, to set variable magnetic polarities of respective free layers of the plurality of MTJs in parallel or anti-parallel conditions with respect to fixed magnetic polarities of respective fixed layers of the plurality of MTJs.

The MRAM cell does not exhibit write errors that have been problematic for conventional spin torque MRAM. The wire supplies spins at 90 degrees to the initial free layer magnetization direction and thus ensures that the free layer responds in a reliable manner.

In accordance with additional, alternative or optional embodiments, the first current exceeds the second current and the second current is initiated and ceased about 5-10 ns or less after the first current is initiated and ceased, respectively.

The initiation of the first current about 5-10 ns or less before the initiation of the second current provides sufficient time for destabilization. Similarly, the ceasing of the first current about 5-10 ns or less before the ceasing of the second current provides sufficient time for setting of free layer magnetization.

According to another embodiment of the present invention, a method of writing to a magneto-resistance random access memory (MRAM) cell is provided. The MRAM cell includes a fixed layer of fixed magnetic polarity electrically connected with a transistor, a free layer of variable magnetic polarity electrically connected with a wire and an insulator interposed between the fixed and free layers. The method includes passing first current through the wire to destabilize the variable magnetic polarity of the free layer, passing second current through the transistor in one of two directions during the first current passage through the wire to direct the variable magnetic polarity of the free layer toward a parallel or anti-parallel condition with respect to the fixed magnetic polarity of the fixed layer and ceasing the first current prior to ceasing the second current to set the variable magnetic polarity of the free layer in the parallel or anti-parallel condition.

The method eliminates write errors that have been problematic for conventional spin torque MRAM. The wire supplies spins at 90 degrees to the initial free layer magnetization direction and thus ensures that the free layer responds in a reliable manner.

In accordance with additional, alternative or optional embodiments, the first current exceeds the second current and the second current is initiated and ceased about 5-10 ns or less after the first current is initiated and ceased, respectively.

The initiation of the first current about 5-10 ns or less before the initiation of the second current provides sufficient time for destabilization. Similarly, the ceasing of the first current about 5-10 ns or less before the ceasing of the second current provides sufficient time for setting of free layer magnetization.

According to another embodiment of the present invention, a method of writing to a magneto-resistance random access memory (MRAM) cell is provided. The method includes electrically connected a fixed layer of fixed magnetic polarity with a transistor, electrically connecting a free layer of variable magnetic polarity with a wire and interposing an insulator between the fixed and free layers. The method also includes passing first current through the wire to destabilize the variable magnetic polarity of the free layer and passing second current through the transistor in one of two directions during the first current passage through the wire to direct the variable magnetic polarity of the free layer toward a parallel or anti-parallel condition with respect to the fixed magnetic polarity of the fixed layer. In addition, the method includes ceasing the first current prior to ceasing the second current to set the variable magnetic polarity of the free layer in the parallel or anti-parallel condition.

The method eliminates write errors that have been problematic for conventional spin torque MRAM. The wire supplies spins at 90 degrees to the initial free layer magnetization direction and thus ensures that the free layer responds in a reliable manner.

In accordance with additional, alternative or optional embodiments, the first current exceeds the second current and the second current is initiated and ceased about 5-10 ns or less after the first current is initiated and ceased, respectively.

The initiation of the first current about 5-10 ns or less before the initiation of the second current provides sufficient time for destabilization. Similarly, the ceasing of the first current about 5-10 ns or less before the ceasing of the second current provides sufficient time for setting of free layer magnetization.

According to yet another embodiment of the present invention, a method of writing to a magneto-resistance random access memory (MRAM) cell is provided. The MRAM cell includes magnetic tunnel junctions (MJTs) in which an insulator is interposed between fixed and free layers of fixed and variable magnetic polarities, respectively. The method includes electrically connecting the fixed layers of the MJTs with corresponding transistors and electrically connecting the free layers of the MJTs with a wire. The method further includes passing first current through the wire to destabilize the variable magnetic polarities of the free layers and passing second current through the transistors in one of two directions during the first current passage through the wire to direct the variable magnetic polarities of the free layers toward a parallel or anti-parallel condition with respect to the fixed magnetic polarities of the fixed layers. In addition, the method includes ceasing the first current prior to ceasing the second current to set the variable magnetic polarities of the free layers in the parallel or anti-parallel condition.

The method eliminates write errors that have been problematic for conventional spin torque MRAM. The wire supplies spins at 90 degrees to the initial free layer magnetization direction and thus ensures that the free layer responds in a reliable manner.

In accordance with additional, alternative or optional embodiments, the first current exceeds the second current and the second current is initiated and ceased about 5-10 ns or less after the first current is initiated and ceased, respectively.

The initiation of the first current about 5-10 ns or less before the initiation of the second current provides sufficient time for destabilization. Similarly, the ceasing of the first current about 5-10 ns or less before the ceasing of the second current provides sufficient time for setting of free layer magnetization.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 7 is an elevational view of the MRAM cell of FIG. 1 in accordance with further embodiments;

DETAILED DESCRIPTION

As will be described below, MTJs are provided on and electrically connected with a metal layer. The tops of the MTJs are respectively electrically connected with transistors. Each MTJ acts as a bit and will be written at a same time. The metal layer is provided as a spin hall wire to select or destabilize the bits to make them easier to write. The writing is accomplished by passing current through the metal layer. This rotates all of the free layers of the MTJs into the plane of the metal layer (i.e., either into or out of the image depending on the sign of the spin hall angle of the metal layer). Then, while the current is being passed through the metal layer, a small current is passed either up or down through each transistor to write each individual bit into the desired state. The current passed through the metal layer is subsequently turned off prior to the small current through each transistor being turned off.

The MJTs and the methods described herein eliminate write errors that have been problematic for spin torque MRAM. That is, while there is no torque when current is first applied in conventional spin torque MRAM unless the free layer thermally fluctuates away from equilibrium, the spin hall wire described herein supplies spins at 90 degrees to the initial free layer magnetization direction and thus ensures that the free layer responds in a reliable manner.

Figure 1:
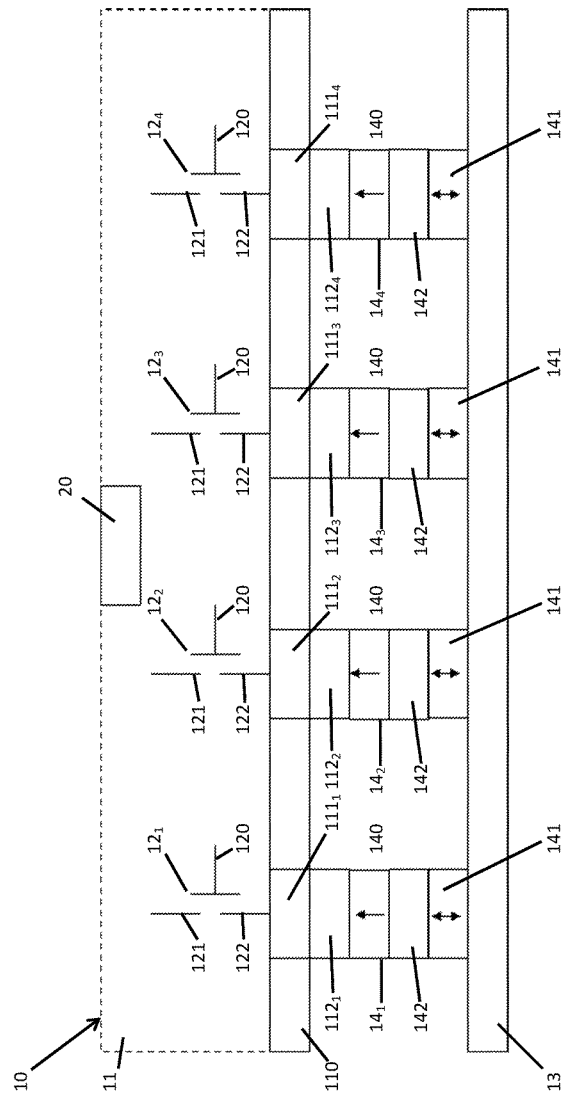
FIG. 1 is an elevational view of an MRAM cell in accordance with embodiments.

With reference to FIG. 1, a magneto-resistance random access memory (MRAM) cell 10 is provided. The MRAM cell 10 includes a substrate 11, first-fourth transistors $12_{1-4}$, a wire 13 and first-fourth MTJs $14_{1-4}$. Each of the first-fourth transistors $12_{1-4}$ is supportively disposed within the substrate 11. The substrate 11 can be provided with a combination of conductive, semi-conductive and non-conductive or dielectric substrate materials. The wire 13 is provided as a spin hall wire possessing a relatively large spin hall angle and can include metal, such as tungsten or tantalum, or metallic alloys. Each of the first-fourth MTJs $14_{1-4}$ is electrically connected between a corresponding one of the first-fourth transistors $12_{1-4}$ and the wire 13.

In accordance with embodiments, the substrate 11 can be formed of dielectric material portions 110 that are interleaved with or formed to surround first-fourth metallic landing pads $111_{1-4}$. The first-fourth metallic landing pads $111_{1-4}$ are proximate to or coupled with corresponding ones of the first-fourth transistors $12_{1-4}$ and can include copper, aluminum, tantalum, tantalum nitride, titanium, titanium nitride, other similar materials and/or combinations thereof. Formation of the first-fourth MTJs 141-4 is accomplished by formation of first-fourth seed layers $112_{1-4}$ on corresponding ones of the first-fourth metallic landing pads $111_{1-4}$ and subsequent deposition or growth of the first-fourth MTJs $14_{1-4}$ on corresponding ones of the first-fourth seed layers $112_{1-4}$.

The first transistor $12_1$ includes a base terminal 120, a collector terminal 121 and an emitter terminal 122. The first MTJ $14_1$ includes a fixed layer 140, a free layer 141 and an insulator 142. The fixed layer 140 can be provided as a layer of magnetic material and has a fixed magnetic polarity and can be coupled directly or indirectly (i.e., via the first seed layer $112_1$ and the first metallic landing pad $111_0$ to or electrically connected with the emitter terminal 122 of the first transistor $12_1$. The free layer 141 can be provided as a layer of magnetic material and has a variable magnetic polarity. The free layer 141 is coupled to or electrically connected with the wire 13. The insulator 142 can be provided as a layer of dielectric material, such as magnesium oxide, and is interposed between the fixed layer 140 and the free layer 141.

During operations of the MRAM cell 10, the variable magnetic polarity of the free layer 141 of the first MTJ $14_1$ can be set in a parallel or anti-parallel condition with respect to the fixed magnetic polarity of the fixed layer 140. In the parallel condition, the first MTJ $14_1$ exhibits reduced resistance to current being passed through it as compared to the anti-parallel condition. Thus, when the variable magnetic polarity of the free layer 141 is set in the parallel condition with respect to the fixed magnetic polarity of the fixed layer 140, the first MTJ $14_1$ can be read as a "1." By contrast, when the variable magnetic polarity of the free layer 141 is set in the anti-parallel condition with respect to the fixed magnetic polarity of the fixed layer 140, the first MTJ $14_1$ can be read as a "0."

The second transistor $12_2$ includes a base terminal 120, a collector terminal 121 and an emitter terminal 122. The second MTJ $14_2$ includes a fixed layer 140, a free layer 141 and an insulator 142. The fixed layer 140 can be provided as a layer of magnetic material and has a fixed magnetic polarity and can be coupled directly or indirectly (i.e., via the second seed layer $112_2$ and the second metallic landing pad $111_2$) to or electrically connected with the emitter terminal 122 of the second transistor $12_2$. The free layer 141 can be provided as a layer of magnetic material and has a variable magnetic polarity. The free layer 141 is coupled to or electrically connected with the wire 13. The insulator 142 can be provided as a layer of dielectric material, such as magnesium oxide, and is interposed between the fixed layer 140 and the free layer 141.

During operations of the MRAM cell 10, the variable magnetic polarity of the free layer 141 of the second MTJ $14_2$ can be set in a parallel or anti-parallel condition with respect to the fixed magnetic polarity of the fixed layer 140. In the parallel condition, the second MTJ $14_2$ exhibits reduced resistance to current being passed through it as compared to the anti-parallel condition. Thus, when the variable magnetic polarity of the free layer 141 is set in the parallel condition with respect to the fixed magnetic polarity of the fixed layer 140, the second MTJ $14_2$ can be read as a "1." By contrast, when the variable magnetic polarity of the free layer 141 is set in the anti-parallel condition with respect to the fixed magnetic polarity of the fixed layer 140, the second MTJ $14_2$ can be read as a "0."

The third transistor $12_3$ includes a base terminal 120, a collector terminal 121 and an emitter terminal 122. The third MTJ $14_3$ includes a fixed layer 140, a free layer 141 and an insulator 142. The fixed layer 140 can be provided as a layer of magnetic material and has a fixed magnetic polarity and can be coupled directly or indirectly (i.e., via the third seed layer $112_3$ and the third metallic landing pad $111_3$) to or electrically connected with the emitter terminal 122 of the third transistor $12_3$. The free layer 141 can be provided as a layer of magnetic material and has a variable magnetic polarity. The free layer 141 is coupled to or electrically connected with the wire 13. The insulator 142 can be provided as a layer of dielectric material, such as magnesium oxide, and is interposed between the fixed layer 140 and the free layer 141.

During operations of the MRAM cell 10, the variable magnetic polarity of the free layer 141 of the third MTJ $14_3$ can be set in a parallel or anti-parallel condition with respect to the fixed magnetic polarity of the fixed layer 140. In the parallel condition, the third MTJ $14_3$ exhibits reduced resistance to current being passed through it as compared to the anti-parallel condition. Thus, when the variable magnetic polarity of the free layer 141 is set in the parallel condition with respect to the fixed magnetic polarity of the fixed layer 140, the third MTJ $14_3$ can be read as a "1." By contrast, when the variable magnetic polarity of the free layer 141 is set in the anti-parallel condition with respect to the fixed magnetic polarity of the fixed layer 140, the third MTJ $14_3$ can be read as a "0."

The fourth transistor $12_4$ includes a base terminal 120, a collector terminal 121 and an emitter terminal 122. The fourth MTJ $14_4$ includes a fixed layer 140, a free layer 141 and an insulator 142. The fixed layer 140 can be provided as a layer of magnetic material and has a fixed magnetic polarity and can be coupled directly or indirectly (i.e., via the fourth seed layer $112_4$ and the fourth metallic landing pad $111_4$) to or electrically connected with the emitter terminal 122 of the fourth transistor $12_4$. The free layer 141 can be provided as a layer of magnetic material and has a variable magnetic polarity. The free layer 141 is coupled to or electrically connected with the wire 13. The insulator 142 can be provided as a layer of dielectric material, such as magnesium oxide, and is interposed between the fixed layer 140 and the free layer 141.

During operations of the MRAM cell 10, the variable magnetic polarity of the free layer 141 of the fourth MTJ $14_4$ can be set in a parallel or anti-parallel condition with respect to the fixed magnetic polarity of the fixed layer 140. In the parallel condition, the fourth MTJ $14_4$ exhibits reduced resistance to current being passed through it as compared to the anti-parallel condition. Thus, when the variable magnetic polarity of the free layer 141 is set in the parallel condition with respect to the fixed magnetic polarity of the fixed layer 140, the fourth MTJ $14_4$ can be read as a "1." By contrast, when the variable magnetic polarity of the free layer 141 is set in the anti-parallel condition with respect to the fixed magnetic polarity of the fixed layer 140, the fourth MTJ $14_4$ can be read as a "0."

While FIG. 1 and the accompanying text refer to there being four transistors and four MTJs in the MRAM cell 10, it is to be understood that this is not required and that there can be greater or lesser numbers of each. For purposes of clarity and brevity, however, the description will generally relate only to the "four/four" embodiments. In any case, it is to be understood that each one of the first-fourth MTJs $14_{1-4}$ represents a "1" or "0" bit in the MRAM cell 10 and can be written and then read as such as described below.

Figure 3:
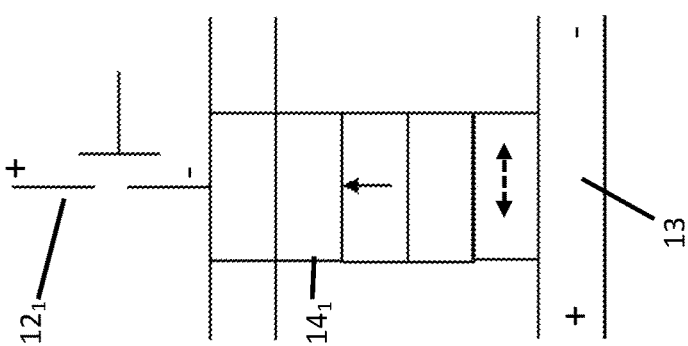
FIG. 3 is an enlarged view of the portion of the MRAM cell of FIG. 2 once passage of a first current through a wire is initiated.
Figure 2:
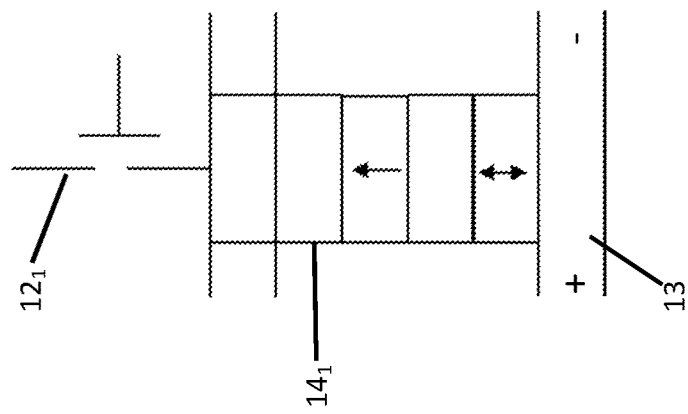
FIG. 2 is an enlarged view of a portion of the MRAM cell of FIG. 1 at an initial time.

With reference to FIGS. 2-5, the setting or writing of each one of the first-fourth MTJs $14_{1-4}$ to a "1" or "0" bit is accomplished by sequentially passing and ceasing first and second currents through the wire 13 and the first-fourth transistors $12_{1-4}$, respectively. In detail, as shown in FIG. 2, the free layer 141 of each of the MTJs $14_{1-4}$ has a variable magnetic polarity that can be disposed in a parallel or anti-parallel condition with the corresponding fixed layer 140 at an initial time. Subsequently, as shown in FIG. 3, the first current is passed through the wire 13 and thus destabilizes the variable magnetic polarity of the free layer 141 in each of the first-fourth MTJs $14_{1-4}$. This destabilization causes the variable magnetic polarities to rotate into a plane of the image or a plane which is parallel with a longitudinal plane P of the wire 13.

Figure 4:
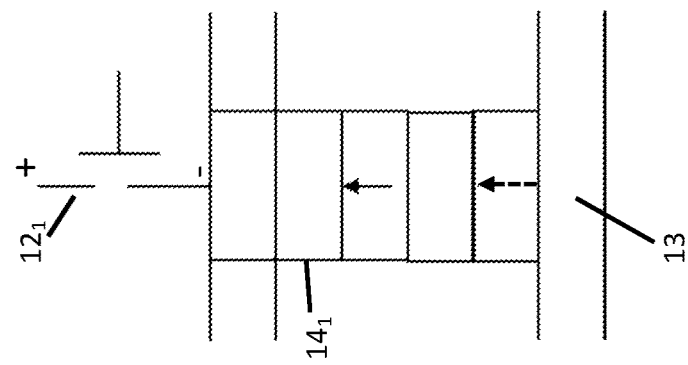
FIG. 4 is an enlarged view of the portion of the MRAM cell of FIG. 3 once passage of a second current through a transistor is initiated.

Next, as shown in FIG. 4, a second current is passed through each of the first-fourth transistors $12_{1-4}$ in one of two directions during the continued passage of the first current through the wire 13 to direct the variable magnetic polarity of the free layer 141 in each of the first-fourth MTJs $14_{1-4}$ toward the parallel or anti-parallel condition with respect to the fixed magnetic polarity of the corresponding fixed layer 140. The two directions can be defined as being up or down directions through the first-fourth transistors $12_{1-4}$. As such, where the fixed magnetic polarity of the fixed layer 140 of each of the first-fourth MTJs $14_{1-4}$ is directed upwardly, passage of the second current in the upward direction through any of the first-fourth transistors $12_{1-4}$ directs the variable magnetic polarity of the corresponding free layer(s) 141 toward the parallel condition while passage of the second current in the downward direction through any of the first-fourth transistors $12_{1-4}$ directs the variable magnetic polarity of the corresponding free layer(s) 141 toward the anti-parallel condition.

Figure 5:
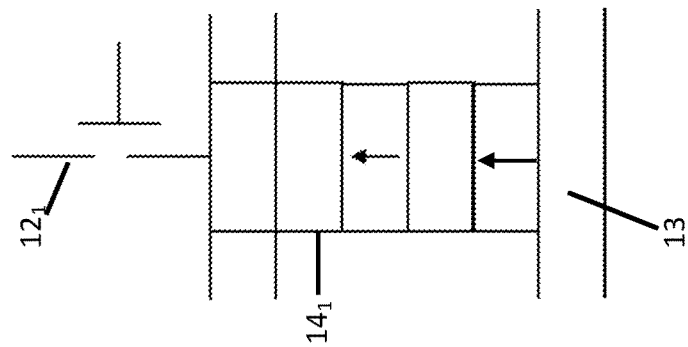
FIG. 5 is an enlarged view of the portion of the MRAM cell of FIG. 4 once passage of the first current and then passage of the second current are ceased.

Subsequently, as shown in FIG. 5, the passage of the first current through the wire 13 is ceased prior to the passage of the second current through the first-fourth transistors $12_{1-4}$ in order to set the variable magnetic polarity of the free layer 141 of each of the first-fourth MTJs $14_{1-4}$ in the parallel or anti-parallel condition.

In accordance with embodiments, a magnitude of the first current that is passed through the wire 13 exceeds a magnitude of the second current that is passed through any of the first-fourth transistors $12_{1-4}$. Indeed, the magnitude of the first current that is passed through the wire 13 can substantially exceed the magnitude of the second current that is passed through any of the first-fourth transistors $12_{1-4}$ and, in some, cases, can exceed or substantially exceed the magnitude of the second current that is passed through the first-fourth transistors $12_{1-4}$ in sum. In addition, the passage of the second current through any of the first-fourth transistors $12_{1-4}$ is initiated about 5-10 ns or less (but greater than 0 ns) or, more particularly, about 0.4-0.6 ns or, even more particularly, about 0.5 ns after the passage of the first current through the wire 13 is initiated. This amount of time is sufficient to destabilize the variable magnetic polarity of the free layer 141 of each of the first-fourth MTJs $14_{1-4}$. Similarly, the passage of the second current through any of the first-fourth transistors $12_{1-4}$ is ceased about 5-10 ns or less (but greater than 0 ns) or, more particularly, about 0.4-0.6 ns or, even more particularly, about 0.5 ns after the passage of the first current through the wire 13 is ceased. This amount of time is sufficient to set the variable magnetic polarity of the free layer 141 of each of the first-fourth MTJs $14_{1-4}$ in the parallel or anti-parallel condition.

The sequence illustrated in FIGS. 2-5 can be controlled by a controller 20 (see FIG. 1). The controller 20 can be supportively disposed in or on the substrate 11 or can be remote from the substrate 11. In either case, the controller 20 is operably coupled to respective supplies of the first current and the second current and is configured to initiate and cease the passage of the first current and the second current through the wire 13 and the first-fourth transistors $12_{1-4}$, respectively, as described herein.

As shown in FIG. 1, the first-fourth MTJs $14_{1-4}$ can be disposable above the wire 13 at least during the processes of FIGS. 2-5. That is, while the formation of the first-fourth metallic landing pads $111_{1-4}$, the first-fourth seed layers $112_{1-4}$ and the first-fourth MTJs $14_{1-4}$ can proceed upwardly from the substrate 11, the connection between the first-fourth MTJs $14_{1-4}$ and the wire 13 can be achieved by flipping the substrate 11 and the first-fourth MTJs $14_{1-4}$ over and then pressing the first-fourth MTJs $14_{1-4}$ downwardly onto the wire 13.

Figure 6:
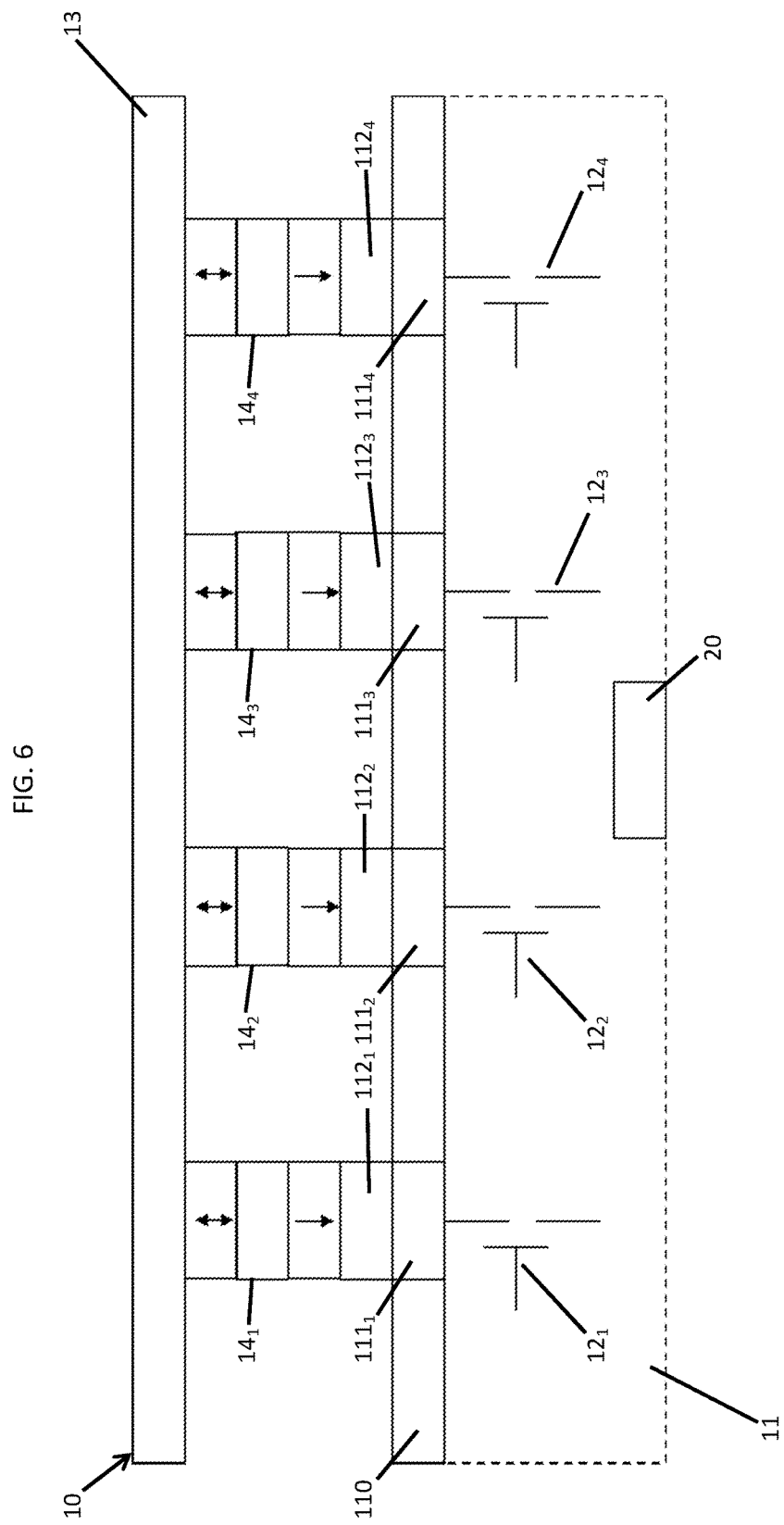
FIG. 6 is an elevational view of an MRAM cell in accordance with alternative embodiments.

In accordance with alternative embodiments and with reference to FIG. 6, the wire 13 can be disposed above the first-fourth MTJs $14_{1-4}$. In this case, the formation of the first-fourth metallic landing pads $111_{1-4}$, the first-fourth seed layers $112_{1-4}$ and the first-fourth MTJs $14_{1-4}$ again proceeds upwardly from the substrate 11, and the connection between the first-fourth MTJs $14_{1-4}$ and the wire 13 is achieved by pressing the wire 13 downwardly onto the first-fourth MTJs $14_{1-4}$.

Figure 8:
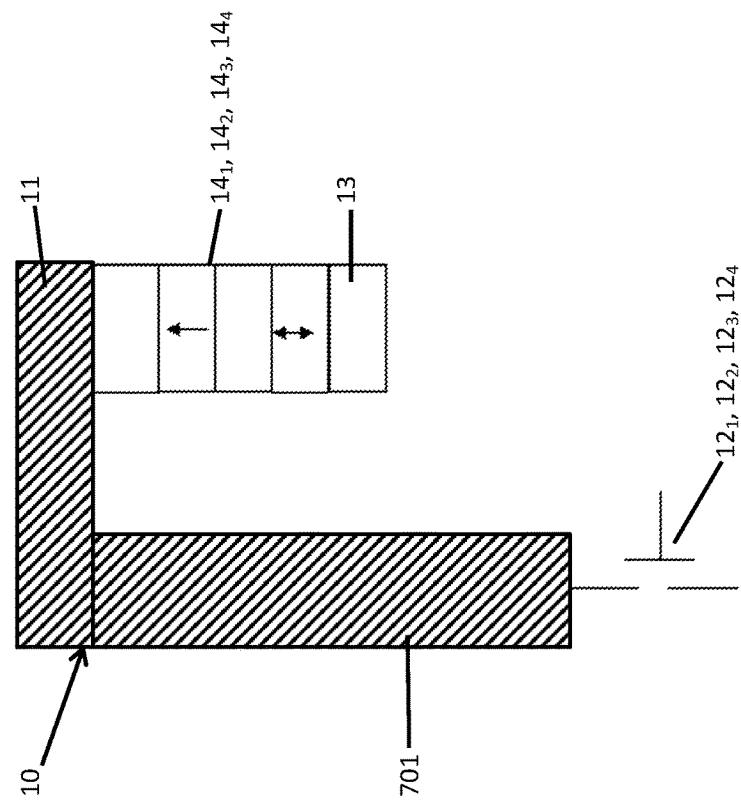
FIG. 8 is a side view of the MRAM cell of FIG. 7.

In accordance with further embodiments and with reference to FIGS. 7 and 8, while the first-fourth MTJs $14_{1-4}$ can be disposable above or below the wire 13, an additional conductive element 701 can be provided between the first-fourth transistors $12_{1-4}$ and the substrate 11. This additional conductive element 701 can have a length that exceeds the combined respective heights of the first-fourth MTJs $14_{1-4}$ and the thickness of the wire 13 such that the first-fourth transistors $12_{1-4}$ are disposable below the wire 13 (see FIG. 8) while the first-fourth MTJs $14_{1-4}$ are above the wire 13.

With the configurations described above, it is to be understood that the MRAM cell 10 is provided such that a sum of all of the second currents through the first-fourth transistors $12_{1-4}$ (or additional transistors) cannot destabilize one of more of the MTJs at an end of the wire 13. Thus, a number of bits that can be provided on the wire 13 can be limited to a relatively small number (e.g., 2-16). This number can be increased by providing shielding around MTJs at the end of the wire 13 or worked around by providing multiple wires 13 each with multiple bits in series or in parallel.

Figure 9:
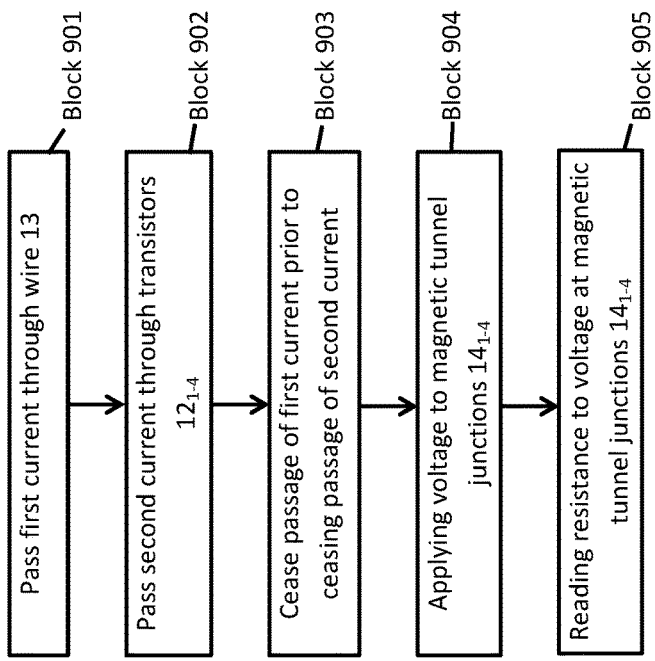
FIG. 9 is a flow diagram illustrating a method of writing data into an MRAM cell in accordance with embodiments.

With reference to FIG. 9, a method of writing and then reading data to the MRAM cell 10 as described above is provided. As shown in FIG. 9, the method includes passing the first current through the wire 13 to destabilize the variable magnetic polarity of the free layer 141 in each of the first-fourth MTJs $14_{1-4}$ (block 901) and passing the second current through the first-fourth transistors $12_{1-4}$ in one of the two directions during the first current passage through the wire 13 (block 902). As explained above, this directs the variable magnetic polarity of the free layer 141 in each of the first-fourth MTJs $14_{1-4}$ toward a parallel or anti-parallel condition with respect to the fixed magnetic polarity of the fixed layer 140. The method further includes ceasing the first current prior to ceasing the second current (block 903) in order to set the variable magnetic polarity of the free layer 141 of the first-fourth MTJs $14_{1-4}$ in the parallel or anti-parallel condition.

In addition, the method can include reading the data or bits written onto the MRAM cell 10 by applying a voltage to each of the first-fourth MTJs $14_{1-4}$ (block 904) and reading a resistance to that applied voltage by each of the first-fourth MTJs $14_{1-4}$ (block 905). Here, a low level of resistance is indicative of the free layer 141 of any of the first-fourth MTJs $14_{1-4}$ being set in the parallel condition and is readable as a "1" and a high level of resistance is indicative of the free layer 141 of any of the first-fourth MTJs $14_{1-4}$ being set in the anti-parallel condition and is readable as a "0."

This method has advantages of eliminating or substantially reducing write errors, which have been until now a key problem for standard spin torque MRAM. In standard spin torque MRAM, there is no torque when the current is first applied unless the free layer thermally fluctuates away from equilibrium. In the present invention, however, the wire 13 supplies spins at 90 degrees to the initial free layer magnetization direction and thus ensures that the free layer responds in a reliable manner.

Figure 11:
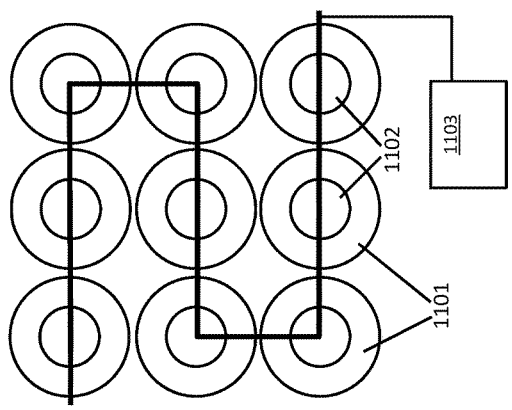
FIG. 11 is a top-down view of an MRAM cell with multiple wires in accordance with further embodiments.
Figure 10:
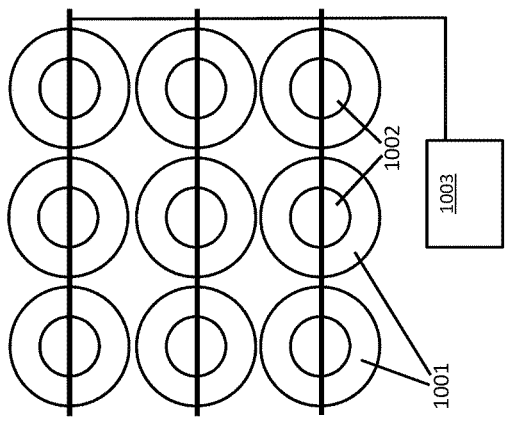
FIG. 10 is a top-down view of an MRAM cell with multiple wires in accordance with further embodiments.

With reference to FIG. 10, the MRAM cell 10 described above can be arranged in a matrix formation with multiple rows and multiple columns of annular dielectric pads 1001 and MJTs 1002. In such cases, the wire 13 described above can be provided as multiple wires 1003 that are respectively arranged along the multiple rows or columns and controlled by one or more controllers 1004. Conversely, with reference to FIG. 11, the MRAM cell 10 described above can be arranged in a matrix formation with multiple rows and multiple columns of annular dielectric pads 1101 and MJTs 1102. In such cases, the wire 13 described above can be provided as a single wire 1103 that is provided in a continuous serpentine configuration and is controlled by a controller 1104

Accordingly, it can be seen from the foregoing detailed description that technical effects and benefits of the invention include the elimination of write errors that have been problematic for spin torque MRAM. As noted above, while there is no torque when current is first applied in conventional spin torque MRAM unless the free layer thermally fluctuates away from equilibrium, the spin hall wire described herein supplies spins at 90 degrees to the initial free layer magnetization direction and thus ensures that the free layer responds in a reliable manner.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

The present invention can be a system, a method, and/or a computer program product. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A magneto-resistance random access memory (MRAM) cell, comprising:
   transistors;
   a wire; and
   magnetic tunnel junctions (MTJs), each comprising a fixed layer of fixed magnetic polarity electrically connected to a corresponding one of the transistors, a free layer of variable magnetic polarity electrically connected with the wire and an insulator between the fixed and free layers,
   wherein:
   first current passed through the wire destabilizes the variable magnetic polarity of the free layer of each of the MTJs,
   second currents each one respectively passed through one of the transistors in one of two directions during first current passage through the wire directs the variable magnetic polarity of the free layer of each of the corresponding MTJs toward parallel or anti-parallel conditions with respect to the fixed magnetic polarity of the corresponding fixed layer,
   a ceasing of the first current prior to a ceasing of the second currents sets the variable magnetic polarity of the free layer of each of the corresponding MTJs in the parallel or anti-parallel conditions,
   the transistors and the MTJs are arranged in a matrix with multiple rows and multiple columns, and
   the wire is provided as a single wire with a serpentine configuration arranged throughout the matrix.

2. The MRAM cell according to claim 1, wherein the first current exceeds the second currents.

3. The MRAM cell according to claim 1, wherein the second currents are initiated and ceased about 5-10 ns or less after the first current is initiated and ceased, respectively.

4. The MRAM cell according to claim 1, wherein the transistors are disposed within a substrate.

5. The MRAM cell according to claim 4, wherein the MTJs are below or above the wire.

6. The MRAM cell according to claim 1 further comprising a controller configured to initiate and cease the first current and the second currents.

7. A magneto-resistance random access memory (MRAM) cell, comprising:
- a wire;
- a plurality of transistors;
- a plurality of MTJs each of which is respectively electrically connected between the wire and a corresponding one of the plurality of transistors; and
- a controller coupled to the wire and the plurality of transistors and configured to sequentially pass and cease a first current through the wire and to pass each one of second currents through one of the plurality of transistors, respectively, to set variable magnetic polarities of each respective free layer of each of the plurality of MTJs in parallel or anti-parallel condition with respect to fixed magnetic polarities of each respective fixed layer of each of the plurality of MTJs,
wherein:
the respective pluralities of the transistors and the MTJs are arranged in a matrix with multiple rows and multiple columns, and
the wire is provided as a single wire with a serpentine configuration arranged throughout the matrix.

8. The MRAM cell according to claim 7, wherein the first current exceeds the second currents.

9. The MRAM cell according to claim 7, wherein the second currents are initiated and ceased about 5-10 ns or less after the first current is initiated and ceased, respectively.

10. The MRAM cell according to claim 7, wherein the plurality of transistors are disposed within a substrate.

11. A method of writing to an array of magneto-resistance random access memory (MRAM) cells in each of which a fixed layer of fixed magnetic polarity is electrically connected with a transistor, a free layer of variable magnetic polarity is electrically connected with a wire and an insulator is interposed between the fixed and free layers, the method comprising:
- passing first current through the wire to destabilize the variable magnetic polarity of each of the free layers;
- passing each one of second currents respectively through one of the transistors in one of two directions during the first current passage through the wire to direct the variable magnetic polarity of each of the free layers toward parallel or anti-parallel conditions with respect to the fixed magnetic polarity of the corresponding fixed layer; and
- ceasing the first current prior to ceasing the second currents to set the variable magnetic polarity of each of the free layers in the parallel or anti-parallel conditions,
wherein:
corresponding ones of the fixed layer, the free layer and the insulator form magnetic tunnel junctions (MTJs),
the transistors are disposed within a substrate,
the transistors and the MTJs are arranged in a matrix with multiple rows and multiple columns, and
the wire is provided as a single wire with a serpentine configuration arranged throughout the matrix.

12. The method according to claim 11, wherein the first current exceeds the second currents.

13. The method according to claim 11, further comprising:
- initiating the second currents about 5-10 ns or less after the first current is initiated; and
- ceasing the second currents about 5-10 ns or less after the first current is ceased.

14. The method according to claim 11, further comprising disposing the MTJs below or above the wire.

15. A method of writing to an array of magneto-resistance random access memory (MRAM) cells, the method comprising:
- electrically connecting fixed layers of fixed magnetic polarity with corresponding transistors;
- electrically connecting free layers of variable magnetic polarity with a wire;
- interposing insulators between the fixed layers and the free layers;
- passing first current through the wire to destabilize the variable magnetic polarity of the free layers;
- respectively passing each one of second currents through one of the transistors in one of two directions during the first current passage through the wire to direct the variable magnetic polarities of the free layers toward parallel or anti-parallel conditions with respect to the fixed magnetic polarities of the fixed layers; and
- ceasing the first current prior to ceasing the second currents to set the variable magnetic polarities of the free layers in the parallel or anti-parallel conditions,
wherein:
corresponding ones of the fixed layer, the free layer and the insulator form magnetic tunnel junctions (MTJs),
the transistors are disposed within a substrate,
the transistors and the MTJs are arranged in a matrix with multiple rows and multiple columns, and
the wire is provided as a single wire with a serpentine configuration arranged throughout the matrix.

16. The method according to claim 15, wherein the first current exceeds the second currents.

17. The method according to claim 15, further comprising:
- initiating the second currents about 5-10 ns or less after the first current is initiated; and
- ceasing the second currents about 5-10 ns or less after the first current is ceased.

18. The method according to claim 15, further comprising disposing the MTJs below or above the wire.

19. A method of writing to an array of magneto-resistance random access memory (MRAM) cells respectively comprising magnetic tunnel junctions (MJTs) in which an insulator is interposed between fixed and free layers of fixed and variable magnetic polarities, respectively, the method comprising:
- electrically connecting the fixed layers of the MJTs with corresponding transistors;
- electrically connecting the free layers of the MJTs with a wire;
- passing first current through the wire to destabilize the variable magnetic polarities of the free layers;
- respectively passing each one of second currents through one of the transistors in one of two directions during the first current passage through the wire to direct the variable magnetic polarities of the free layers toward parallel or anti-parallel conditions with respect to the fixed magnetic polarities of the fixed layers; and
- ceasing the first current prior to ceasing the respective second currents to set the variable magnetic polarities of the free layers in the parallel or anti-parallel conditions,
wherein:

the transistors and the MTJs are arranged in a matrix with multiple rows and multiple columns, and
the wire is provided as a single wire with a serpentine configuration arranged throughout the matrix.

\* \* \* \* \*